(12) United States Patent
Chen et al.

(10) Patent No.: US 9,072,194 B2
(45) Date of Patent: Jun. 30, 2015

(54) CABLE MANAGEMENT DEVICE

(71) Applicants: KING SLIDE WORKS CO., LTD., Kaohsiung (TW); KING SLIDE TECHNOLOGY CO., LTD., Kaohsiung (TW)

(72) Inventors: Ken-Ching Chen, Kaohsiung (TW); Shun-Ho Yang, Kaohsiung (TW); Chien-Li Huang, Kaohsiung (TW); Chun-Chiang Wang, Kaohsiung (TW)

(73) Assignees: King Slide Works Co., Ltd., Kaohsiung (TW); King Slide Technology Co., Ltd., Kaohsiung (TW)

( * ) Notice: Subject to any disclaimer, the term of this patent is extended or adjusted under 35 U.S.C. 154(b) by 281 days.

(21) Appl. No.: 13/858,427

(22) Filed: Apr. 8, 2013

(65) Prior Publication Data

US 2014/0158834 A1 Jun. 12, 2014

Related U.S. Application Data

(63) Continuation-in-part of application No. 13/707,837, filed on Dec. 7, 2012.

(51) Int. Cl.
*A47F 7/00* (2006.01)
*H05K 7/14* (2006.01)

(52) U.S. Cl.
CPC ............ *H05K 7/1491* (2013.01); *H05K 7/1421* (2013.01)

(58) Field of Classification Search
CPC ..... H05K 7/02; H05K 7/1421; H05K 7/1491; F16L 3/00; F16L 3/01; F16L 3/015; F16L 3/02; F16L 3/06
USPC ............... 211/26; 174/68.3; 248/70; 361/747
See application file for complete search history.

(56) References Cited

U.S. PATENT DOCUMENTS

| | | | |
|---|---|---|---|
| 7,472,795 B2 | 1/2009 | Dubon et al. | |
| 7,554,819 B2 | 6/2009 | Chen et al. | |
| 7,654,398 B2 | 2/2010 | Bridges et al. | |
| 7,712,615 B2 | 5/2010 | Chen et al. | |
| 7,746,667 B1 | 6/2010 | Baiza et al. | |
| 8,231,014 B2 | 7/2012 | Chen et al. | |
| 8,251,321 B2 * | 8/2012 | Chen et al. | 248/70 |
| 2006/0081736 A1 * | 4/2006 | Chen et al. | 248/68.1 |
| 2006/0113433 A1 * | 6/2006 | Chen et al. | 248/70 |
| 2008/0164789 A1 * | 7/2008 | Williams | 312/223.1 |
| 2009/0014601 A1 * | 1/2009 | Chen et al. | 248/70 |
| 2009/0065658 A1 * | 3/2009 | Chen et al. | 248/70 |
| 2010/0193646 A1 * | 8/2010 | Chen et al. | 248/70 |
| 2011/0180297 A1 * | 7/2011 | Yu et al. | 174/69 |

* cited by examiner

*Primary Examiner* — Korie H Chan
(74) *Attorney, Agent, or Firm* — Rosenberg, Klein & Lee

(57) ABSTRACT

A cable management device includes a first cable management arm, a second cable management arm, a cable management seat pivotably connected between the first and second cable management arms, an extension board fixed to the cable management seat, a support seat, a first support member pivotably connected to the support seat, a second support member slidably connected to the first support member, a guide member connected to the second support member and extended between the first and second cable management arms, a first resilient member connected between the first and second support members and a slide pivotably connected to the extension board and slidably connected to the second support member. When the second cable management arm is retracted, the second cable management arm pushes the guide member and drives the first and second support member to swing relative to the support seat.

10 Claims, 9 Drawing Sheets

CABLE MANAGEMENT DEVICE

CROSS-REFERENCE TO RELATED APPLICATIONS

This is a continuation-in-part application of U.S. patent application Ser. No. 13/707,837, filed Dec. 7, 2012, currently pending. The contents of the aforementioned application are incorporated herein by reference.

FIELD OF THE INVENTION

The present invention relates to a cable management device, and more particularly, to a support device for cable management.

BACKGROUND OF THE INVENTION

U.S. Pat. No. 7,472,795 B2 to Dubon et al., U.S. Pat. No. 7,654,398 B2 to Bridges et al., U.S. Pat. No. 7,746,667 B1 to Baiza et al., and U.S. Pat. No. 7,554,819 B2, U.S. Pat. No. 7,712,615 B2, U.S. Pat. No. 8,231,014 B2 and U.S. Pat. No. 8,251,321 B2 to Chen et al. disclose conventional support devices for cable management and these support devices are referenced when describing the present invention.

However, these conventional support devices are not convenient when being installed and operated. The present invention intends to provide a support device for cable management and improves the shortcomings of the conventional support devices.

SUMMARY OF THE INVENTION

The present invention relates to a cable management device and comprises a first cable management arm, a second cable management arm, a cable management seat, an extension board, a support seat, a first support member, a second support member, a guide member, a first resilient member and a slide. The cable management seat is pivotably connected between the first and second cable management arms. The extension board is fixed to the cable management seat. The support seat has a support board. A first connection element is connected to the first cable management arm and a second connection element is connected to the second cable management arm. A third connection element is connected to the support seat. The first support member has a first connecting end and a first free end which is located corresponding to the first connecting end. The first support member is pivotably connected to the support seat by the first connecting end. The first support member contacts the support board of the support seat. The second support member has a second connecting end and a second free end which is located corresponding to the second connecting end. The second support member is slidably connected to the first support member. The second support member is extended relative to the first support member to move the second free end away from the first support member. The second free end has a guide member which is extended therefrom and located between the first and second cable management arms. The first resilient member is connected between the first and second support members so as to provide a pull force to the second support member. That is to say, the second support member is pulled by the first resilient member relative to the first support member. A slide is pivotably connected to the extension board and slidably connected to the second support member. The first cable management arm is connected to a stationary first position by the first connection element. The second cable management arm is connected to a changeable second position by the second connection element. The support seat is connected to a stationary third position by the third connection element. When the second connection element of the second cable management arm is moved away from the first connection element of the first cable management arm, the cable management seat slides along the second support member by the slide and moves away from the support seat. The slide contacts the guide member and extends the second support member relative to the first support member so as to swing the first support member relative to the support seat.

Preferably, the second support member has a block at the second connecting end and the block is located corresponding to the slide, so that the slide slides between the guide member and the block.

Preferably, the first support member has a first hook and the second support member has a second hook. The first resilient member is connected to the first and second hooks.

Preferably, the support seat, the third connection element and the first support member are pivotably connected to each other by a pivotal member.

Preferably, the support board of the support seat extends substantially horizontally and has a round periphery whose center is the same with the center of the pivotal member. A pin is connected to the first support member and the pin slidably contacts the periphery of the support board.

Preferably, the support board of the support seat has two first stops. A range of the first support member that is pivotable relative to the support seat is restricted between the two first stops.

Preferably, the extension board has a rib extending downward, and the rib contacts the slide.

Preferably, the stop member is connected to the support seat and has two second stops. The third connection element has an extension portion located corresponding to the two second stops. One of the two second stops of the stop member contacts the extension portion of the third connection element.

Preferably, the present invention comprises a first slide assembly which comprises a first stationary rail and a first movable rail which moves longitudinally relative to the first stationary rail. A second slide assembly comprises a second stationary rail and a second movable rail which moves longitudinally relative to the second stationary rail. The first connection element is installed to the first stationary rail and fixedly located at the first position. The second connection element is installed to the first movable rail and located at the second position which is changeable when the first movable rail is moved relative to the first stationary rail. The third connection element is installed to the second stationary rail of the second rail assembly and fixedly located at the third position.

Alternatively, the present invention provides a cable management system and comprises a first slide assembly comprising a first stationary rail and a first movable rail which moves longitudinally relative to the first stationary rail. A second slide assembly comprises a second stationary rail and a second movable rail which moves longitudinally relative to the second stationary rail. A first cable management arm is connected to the first stationary rail of the first slide assembly. A second cable management arm is connected to the first movable rail of the first slide assembly. A cable management seat is pivotably connected between the first and second cable management arms. A support seat is connected to the second stationary rail of the second slide assembly. A first support member has a first connecting end and a first free end which is located corresponding to the first connecting end. The first connecting end is pivotably connected to the support seat. A second support member has a second connecting end and a second free end which is located corresponding to the second connecting end. The second connecting end is slidably connected to the first support member. The second free end has a guide member which is extended therefrom and located between the first and second cable management arms. A first resilient member is connected between the first and second support members. A slide is pivotably connected to the cable management seat and slidably connected to the second support member. When the first and second slide assemblies are pulled out, the second cable management arm is moved away from the first cable management arm. The slide slides along the second support member and moves away from the support seat. The slide contacts the guide member and extends the second support member relative to the first support member so as to swing the first support member relative to the support seat. When the first and second slide assemblies are retracted, the second cable management arm is retracted relative to the first cable management arm. The second cable management arm contacts the guide member and drives the second support member which moves in response to the first resilient member and relative to the first support member.

The present invention will become more obvious from the following description when taken in connection with the accompanying drawings which show, for purposes of illustration only, a preferred embodiment in accordance with the present invention.

DETAILED DESCRIPTION OF THE PREFERRED EMBODIMENT

Figure 1:
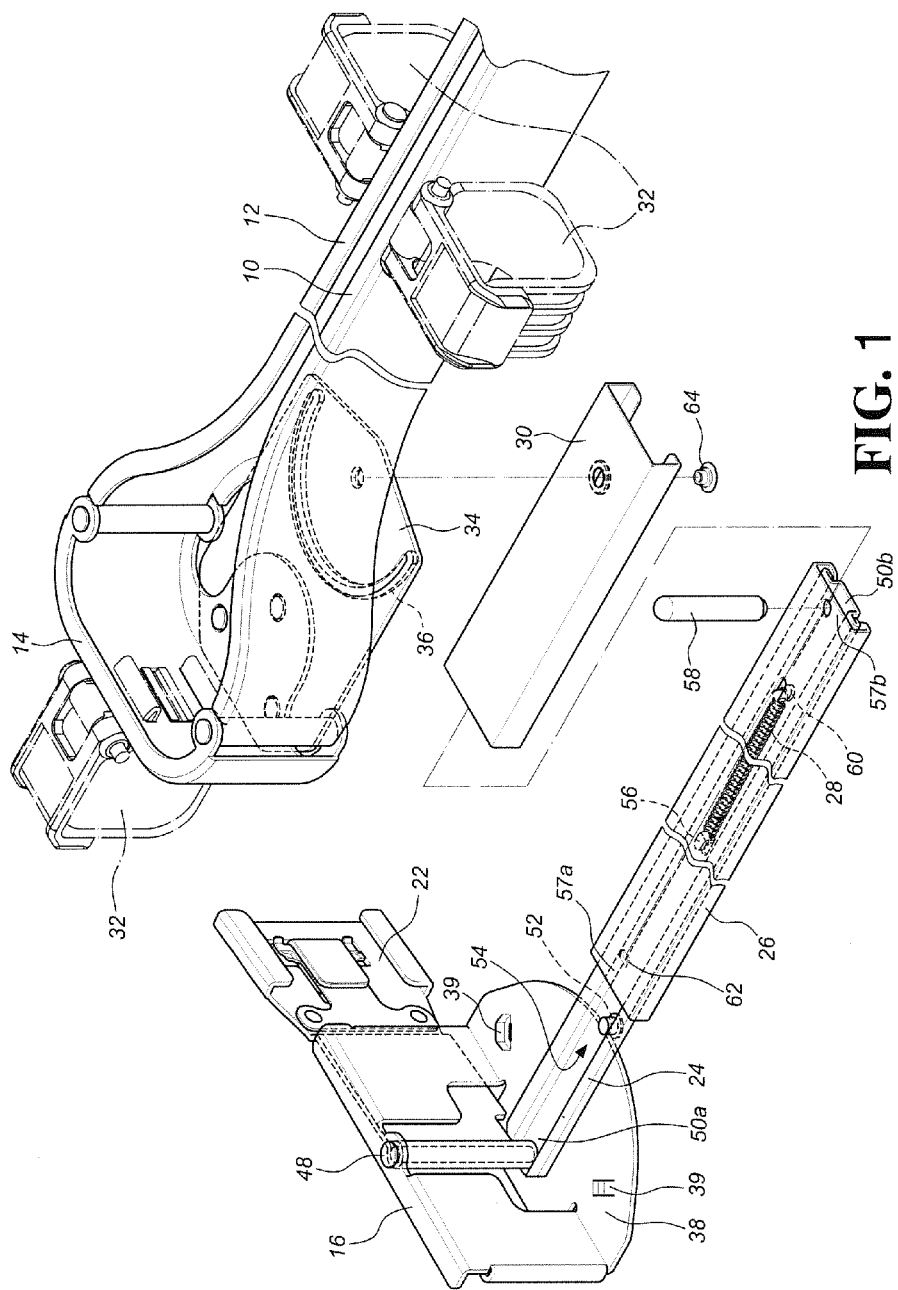
FIG. 1 is an exploded view to show the cable management device of the present invention.
Figure 2:
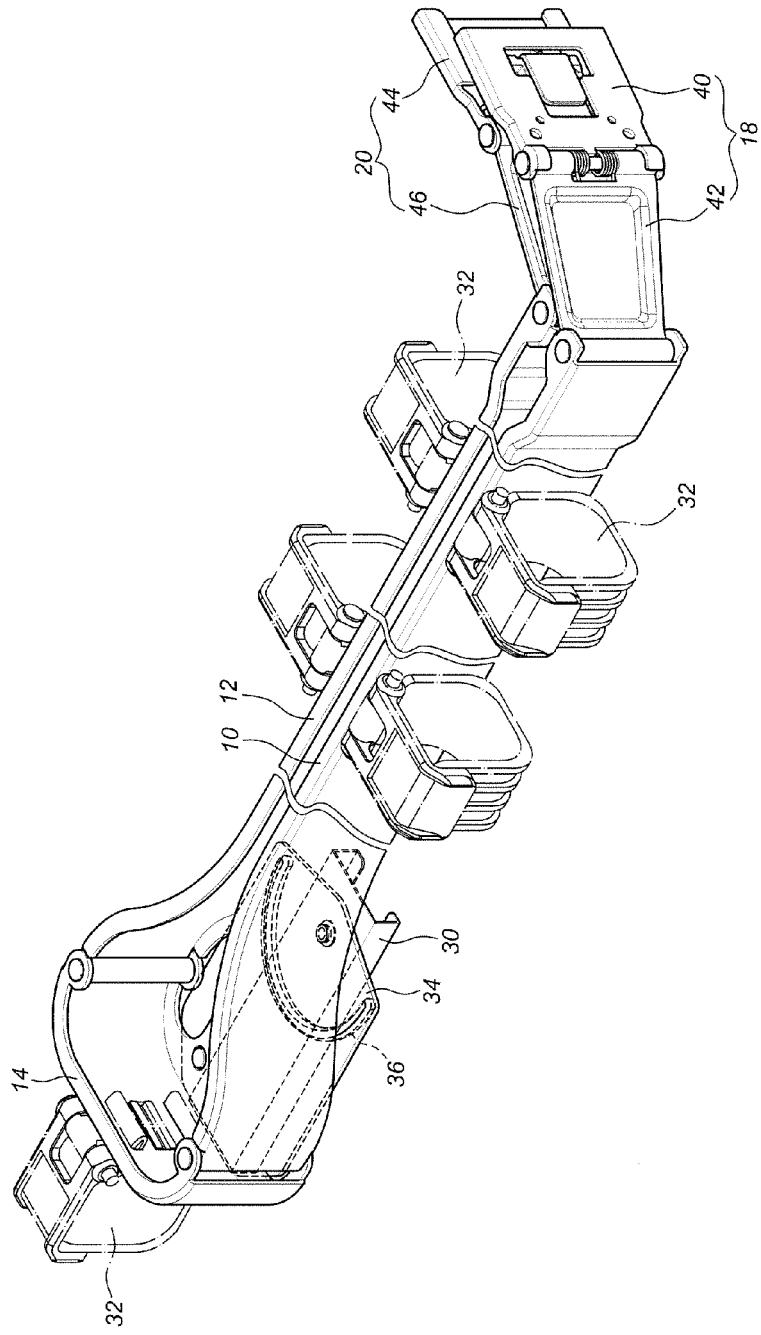
FIG. 2 is a perspective view to show a portion of the cable management device of the present invention.

Referring to FIGS. 1 and 2, the cable management device of the present invention comprises a first cable management arm 10, a second cable management min 12, a cable management seat 14, a support seat 16, a first connection element 18, a second connection element 20, a third connection element 22, a first support member 24, a second support member 26, a first resilient member 28, a slide 30 and multiple cable supports 32. Some of the cable supports 32 are located at the first cable management arm 10, the second cable management arm 12 and the cable management seat 14 so that cables (not shown) are put on the cable supports 32.

The cable management seat 14 is pivotably connected between the first and second cable management arms 10, 12. The cable management seat 14 has an extension board 34. In a preferable embodiment, the extension board 34 is a single member and fixed to the underside of the cable management seat 14. Alternatively, the extension board 34 and the cable management seat 14 are a one-piece part so that the extension board 34 can be deemed as a portion of the cable management seat 14. In a preferable embodiment, the extension board 34 has a rib 36 extending downward therefrom.

The support seat 16 has a support board 38. In a preferable embodiment, the support board 38 of the support seat 16 extends substantially horizontally and has a round periphery. Preferably, the periphery of the support board 38 that points the first support member 24 is generally formed as a semicircular about the pivotal member 48. The support board 38 of the support seat 16 has two first stops 39.

The first connection element 18 is connected to the first cable management arm 10 and has a first engaging member 40 and a first connection member 42 pivotably connected to the first engaging member 40. In a preferable embodiment, the first connection member 42 is pivotably connected to the first cable management arm 10.

The second connection element 20 is connected to the second cable management arm 12 and has a second engaging member 44 and a second connection member 46 pivotably connected to the second engaging member 44. In a preferable embodiment, the second connection member 46 is pivotably connected to the second cable management arm 12.

The third connection element 22 is pivotably connected to the support seat 16 by a pivotal member 48.

The first support member 24 has a first connecting end 50a and a first free end 50b which is located corresponding to the first connecting end 50a. In a preferable embodiment, the first connecting end 50a of the first support member 24 is pivotably connected to the support board 38 of the support seat 16 by the pivotal member 48. The first support member 24 contacts the support board 38 of the support seat 16 and is located between the two first stops 39 so that the range of the first support member 24 that is pivotable relative to the support seat 16 is restricted between the two first stops 39. In a preferable embodiment, a pin 52 is connected to the first support member 24, and the center of the periphery of the support board 38 is the same with the center of the pivotal member 48. When the first support member 24 swings relative to the support seat 16, the pin 52 slidably contacts the periphery of the support board 38. The first support member 24 has a path 54 and a first hook 56, wherein the path 54 is a recessed area extending along the first support member 24, and the first hook 56 extends from the wall of the path 54.

Figure 3:
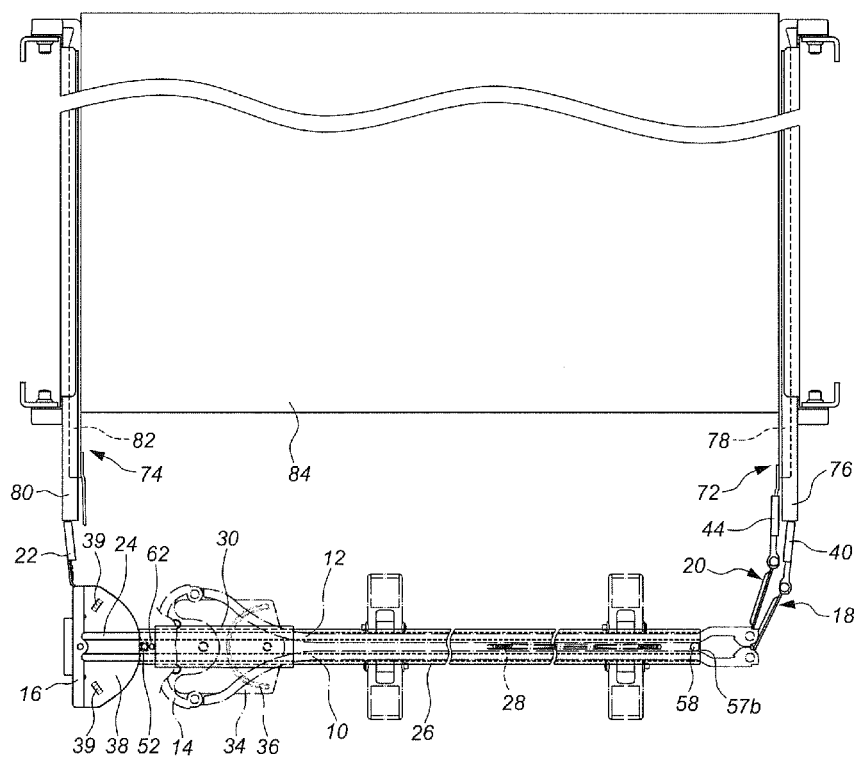
FIG. 3 shows that the cable management device of the present invention is at the retracted position.

The second support member 26 has a second connecting end 57a and a second free end 57b which is located corresponding to the second connecting end 57a. The second support member 26 is slidably connected to the first support member 24, such as slidably mounted to the first support member 24 so that the second support member 26 is extendable and retractable relative to the first support member 24. When the second support member 26 is extended relative to the first support member 24, the second free end 57b is moved away from the first support member 24. The second free end 57b has a guide member 58 which is extended therefrom and located between the first and second cable management arms 10, 12 as shown in FIG. 3. In a preferable embodiment, the second support member 26 has a second hook 60 extending toward the path 54 of the first support member 24. The second connecting end 57a of the second support member 26 has a block 62, and the block 62 is located corresponding to the slide 30, so that the slide 30 slides between the guide member 58 and the block 62.

The first resilient member 28 is connected between the first and second hooks 56, 60 of the support members 24, 26, so that the second support member 26 is pulled by the first resilient member 28 to the first support member 24 when the second support member 26 is extended relative to the first support member 24. In other words, the second support member 26 is able to respond the force from the first resilient member 28 and move relative to the first support member 24. For example, the second support member 26 is correspondingly retracted to the first support member 24 by the force of the first resilient member 28 from an extended status.

The slide 30 is pivotably connected to the underside of the extension board 34 by a pivot 64, and slidable between guide member 58 of the second support member 26 and the block 62 as shown in FIG. 3. It is noted that the extension board 34 is deemed as a portion of the cable management seat 14, so that the slide 30 pivotably connected to the cable management seat 14 can be considered as the same with the slide 30 pivotably connected to the extension board 34. In a preferable embodiment, the pivot 64 extends through the slide 30 and the extension board 34, and is cooperated with the contact between the slide 30 and the rib 36 of the extension board 34, to let the slide 30 and the extension board 34 be snugly in contact with each other in vertical direction and hence to prevent the first and second cable management arms 10 and 12 from sagging. When the slide 30 moves to the second free end 57b of the second support member 26, the slide 30 contacts the guide member 58 so as to drive the second support member 26 to extend relative to the first support member 24.

FIG. 3 shows the cable management device is connected to the first slide assembly 72 and the second slide assembly 74. The first slide assembly 72 comprises a first stationary rail 76 and a first movable rail 78 which moves longitudinally relative to the first stationary rail 76. The second slide assembly 74 comprises a second stationary rail 80 and a second movable rail 82 which moves longitudinally relative to the second stationary rail 80. A servo equipment 84 is connected to the first movable rail 78 and the second movable rail 82 of the first and second slide assemblies 72, 74, the cables (not shown) of the servo equipment 84 is positioned by the first and second cable management arms 10, 12 and the cable management seat 14. The first cable management aim 10 is connected to the first stationary rail 76 of the first slide assembly 72 by the first engaging member 40 of the first connection element 18 so as to position one end of the first cable management arm 10 at a first position. The second cable management arm 12 is connected to the first movable rail 78 of the first slide assembly 72 by the second engaging member 44 of the second connection element 20 so as to position one end of the second cable management arm 12 at a second position. The second position is changeable when the first movable rail 78 of the first slide assembly 72 moves relative to the first stationary rail 76. The support seat 16 is connected to the second stationary rail 80 of the second slide assembly 74 by the third connection element 22 so as to position at a third position.

As shown in FIG. 3, when the first and second slide assemblies 72, 74 are in retracted status, the second cable management arm 12 moves toward and close to the first cable management arm 10 to form a long cantilever beam so that the center of weight of the whole cable management device is located toward the cable management seat 14. The second support member 26 is retracted to the first support member 24, and the first support member 24 contacts the support board 38 of the support seat 16. The cable management seat 14 is located adjacent to the support seat 16 by the slide 30 mounted to the second support member 26. Therefore, under the retracted status that the second cable management arm 12 located close to the first cable management arm 10, the support seat 16 provides efficient support to the cable management device.

Figure 4:
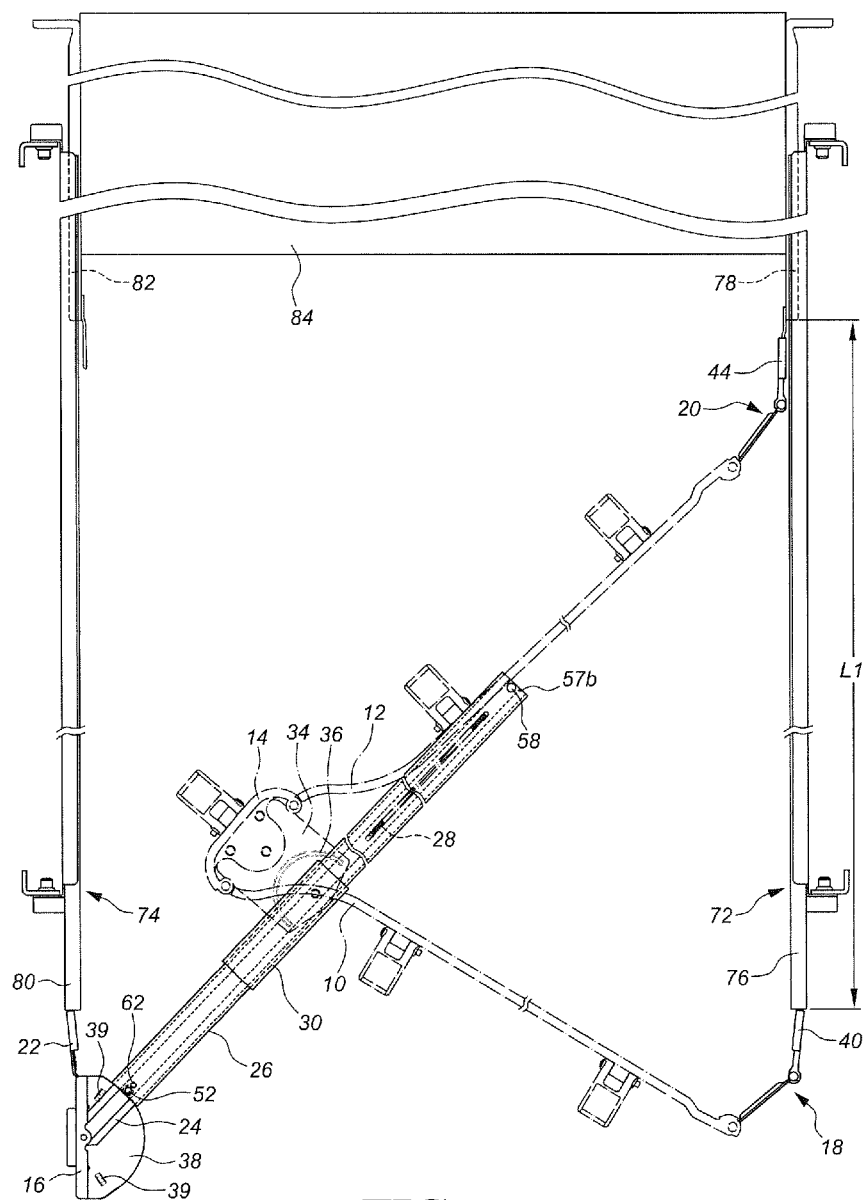
FIG. 4 shows that the second connection element of the second cable management arm is moved to a first distance relative to the first connection element of the first cable management arm.

FIG. 4 shows that the first and second movable rails 78, 82 of the first and second slide assemblies 72, 74 are initially extended out, the second connection element 20 of the second cable management arm 12 moves a first distance L1 relative to the first connection element 18 of the first cable management arm 10. The second support member 26 is not yet extended relative to the first support member 24. The cable management seat 14 and the extension board 34 move straightly along the second support member 26 by the slide 30. The cable management seat 14 moves a longitudinal displacement along with the movement of the second cable management arm 12. Therefore, the cable management seat 14 drives the first support member 24 to swing relative to the support seat 16 by the slide 30 and the second support member 26. The swinging of the first support member 24 makes the guide member 58 contact the second cable management arm 12, so that the second free end 57b of the second support member 26 is maintained between the first and second cable management arms 10, 12. In the meanwhile, the slide 30 is pivotable relative to the extension board 34. Under the present status, the center of weight of the whole cable management device is transferred gradually from the support seat 16 to the second support member 26, and the support seat 16 and the second support member 26, including the first support member 24, together provide an efficient support to the cable management device.

Figure 5:
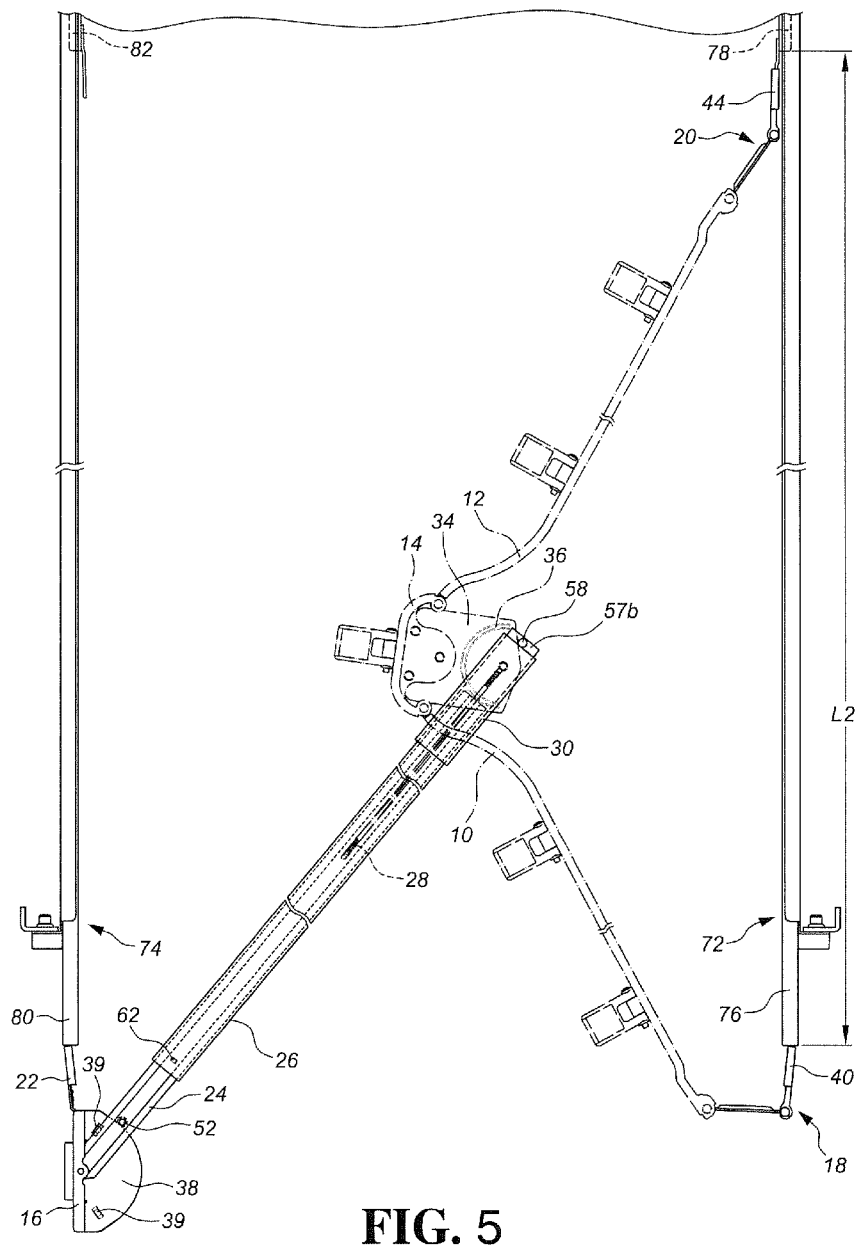
FIG. 5 shows that the second connection element of the second cable management arm is moved to a second distance relative to the first connection element of the first cable management arm.

FIG. 5 shows that when the second connection element 20 of the second cable management arm 12 continuously moves to the second distance L2 relative to the first connection element 18 of the first cable management arm 10. The cable management seat 14 and the extension board 34 move along the second support member 26 to the guide member 58 by the slide 30. When the slide 30 contacts the guide member 58, the slide 30 drives the second support member 26 to extend relative to the first support member 24, and the first resilient member 28 is stretched by the second support member 26 to generate a force which is able to pull the second support member 26 back. Because the cable management seat 14 is moves away from the support seat 16 and toward the first slide assembly 72, when the cable management seat 14 is gradually moves close to the center of the transverse distance between the first and second slide assemblies 72, 74, the center of the weight that the cable management device supports is gradually transferred from the support seat 16 to the first and second cable management arms 10, 12 which can be deemed as in the form of shorter cantilever beams. The first and second support members 24, 26 are supported by the support seat 16 and assist to support the weight that the first and second cable management arms 10, 12 support. Therefore, the first and second support members 24, 26, and the first and second cable management aims 10, 12 form a truss-like structure to support the weight of the cable management device.

Figure 6:
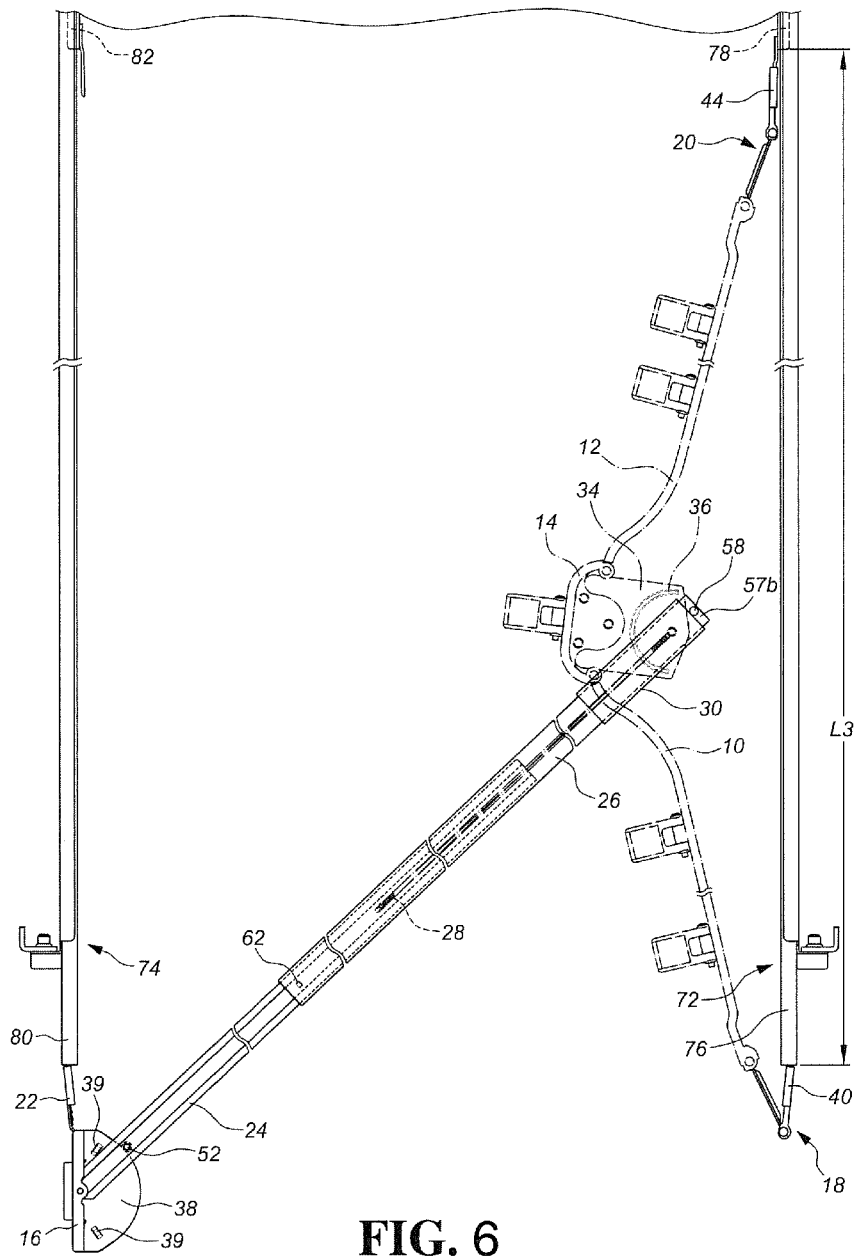
FIG. 6 shows that the second connection element of the second cable management arm is moved to a third distance relative to the first connection element of the first cable management arm.

FIG. 6 shows that the second connection element 20 of the second cable management arm 12 continuously moves to the second distance L3 relative to the first connection element 18 of the first cable management arm 10. The cable management seat 14 and the extension board 34 carried by the slide 30 extend the second support member 26 away from the first support member 24, and the first resilient member 28 continuously provides a pull force to the second support member 26. The cable management seat 14 moves over the center of the transverse distance between the first and second slide assemblies 72, 74, and close to the first slide assembly 72. Therefore, the most of the weight of the cable management device will be transferred to and supported by the first and second cable management arms 10, 12 and the weight that the first and second support members 24, 26 support is reduced.

Figure 7:
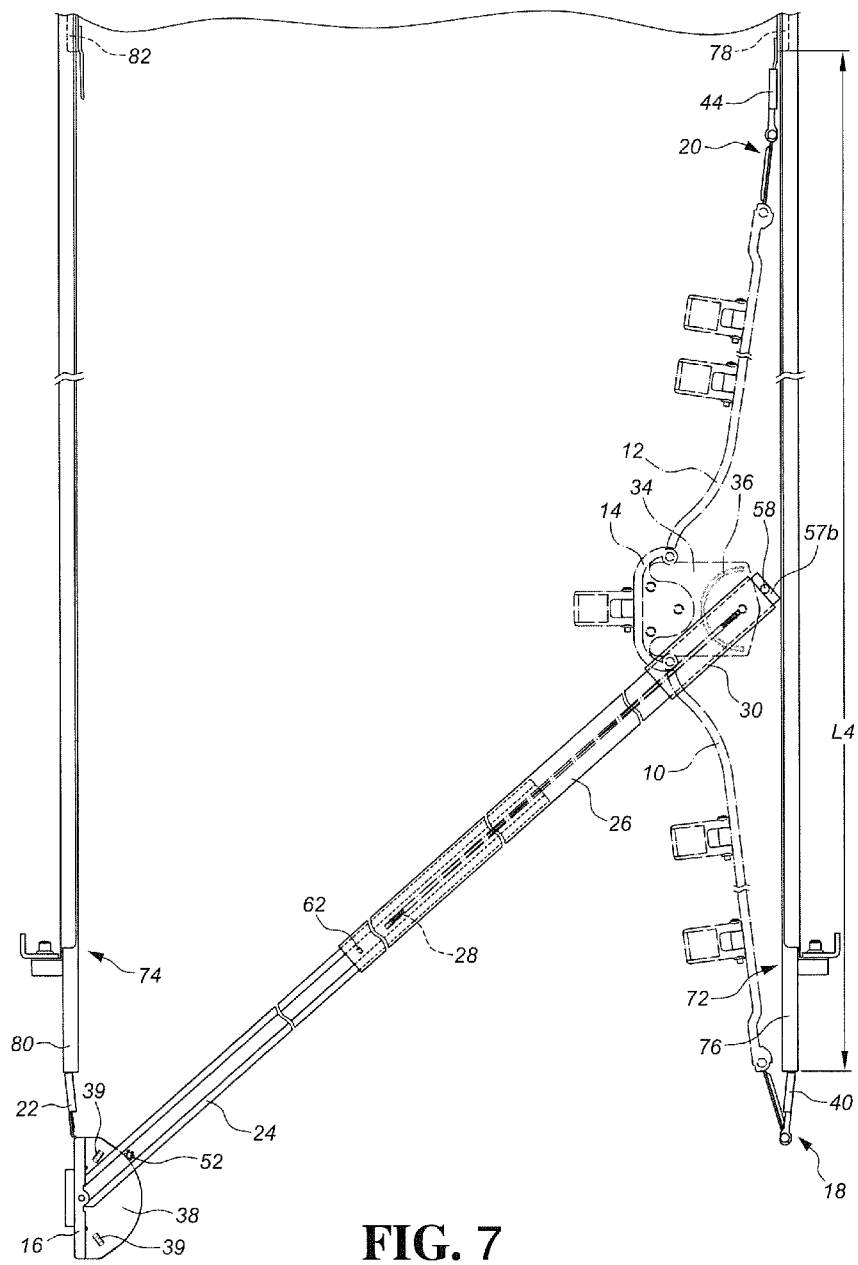
FIG. 7 shows that the second connection element of the second cable management arm is moved to a fourth distance relative to the first connection element of the first cable management arm.

FIG. 7 shows that the second connection element 20 of the second cable management arm 12 moves to the complete extended fourth distance L4 relative to the first connection element 18 of the first cable management arm 10. The cable management seat 14 and the extension board 34 extend completely relative to the first support member 24 by the slide 30 driving the second support member 26. The first support member 24 continuously swings relative to the support seat 16, and the first resilient member 28 continuously apply a pull force to the second support member 26. Under this status, the cable management seat 14 is located very close to the first slide assembly 72, so that the most of the weight of the cable management device is supported by the first and second cable management arms 10, 12 which can be deemed as cantilever beams with the shortest suspension length. The first and second support members 24, 26 are located at the underside of the cable management seat 14 and do not support the weight of the cable management device.

Figure 8:
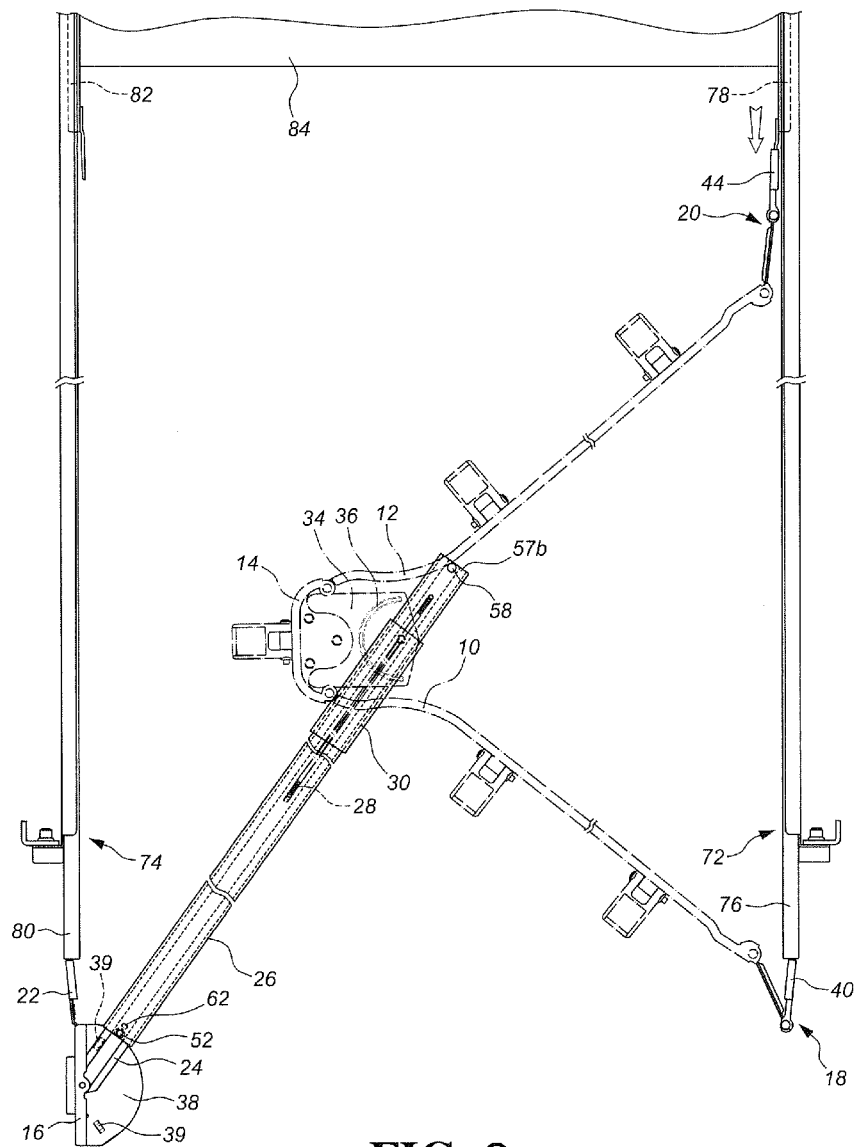
FIG. 8 shows the cable management device of the present invention is retracted.

It is noted that during the retracting process of the cable management device, the second support member 26 responds the force of the first resilient member 28 so as to be automatically pulled back relative to the first support member 24. In other words, when the slide 30 moves along the second support member 26 and toward the support seat 16, the second support member 26 is automatically retracted relative to the first support member 24, and the guide member 58 contacts the slide 30, so that the movement of the slide 30 and the second support member 26 are simultaneously proceeded. On the other hand, as shown in FIG. 8, when the second and first support members 26, 24 are retracted, and the slide 30 continuously slides on the second support member 26, the second cable management arm 12 directly contacts the guide member 58 of the second free end 57b of the second support member 26, so that the operation of the overall mechanism of the cable management device is smooth and the first support member 24 swings back to the pre-set retracted position. Besides, when the guide member 58 of the second support member 26 is in contact with the second cable management arm 12, the first stops 39 of the support seat 16 contact the first support member 24 to restrict the first and second support members 24, 26 not overly swing toward the second slide assembly 74 so as not to affect the approach of the second cable management arm 12 toward the first cable management arm 10.

Figure 9:
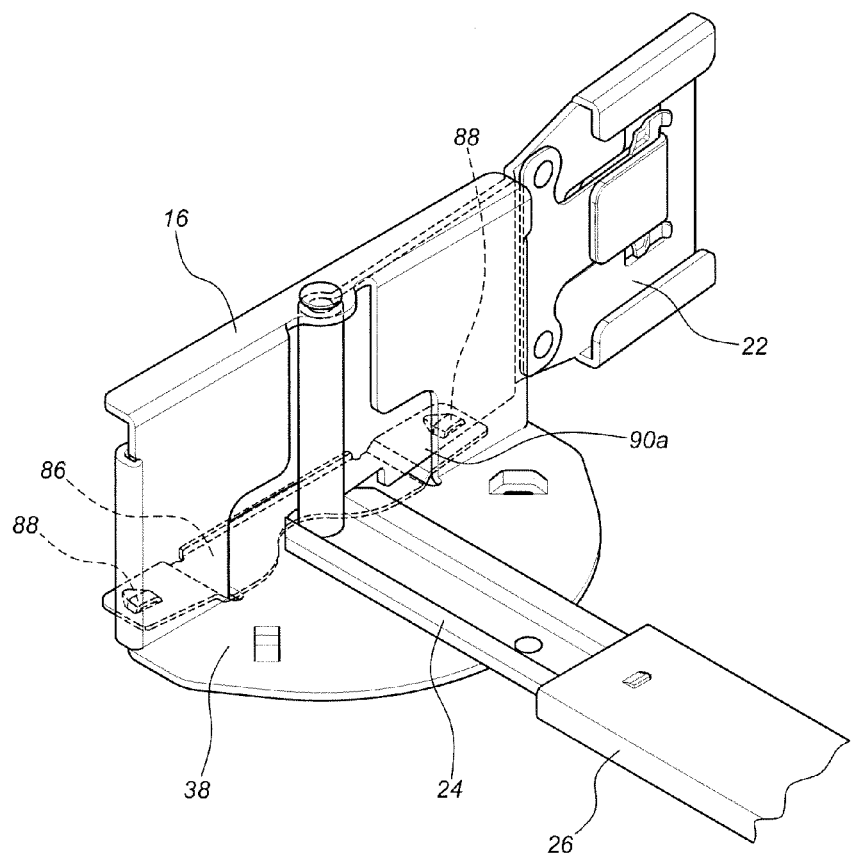
FIG. 9 shows that the stop member contacts the first support member.

FIG. 9 shows that one preferable embodiment has a stop member 86 which is connected to the support seat 16 and has two second stops 88. The third connection element 22 has an extension portion 90a located corresponding to the two second stops 88. One of the second stops 88 of the stop member 86 contacts the extension portion 90a of the third connection element 22, so that the connection between the support seat 16 and the third connection element 22 can be maintained and does not swing.

The cable management device is firmly and statically supported when in the retracted status as shown in FIG. 3. The weight of the whole cable management device is shared and dynamically supported by the correspondingly varied structure of the cable management device when in extended statuses as shown in FIGS. 4-7. Consequently, the cable management device does not overly sagging when the cable management device carried cables.

While we have shown and described the embodiment in accordance with the present invention, it should be clear to those skilled in the art that further embodiments may be made without departing from the scope of the present invention.

What is claimed is:
1. A cable management device comprising:
a first cable management arm;
a second cable management arm;
a cable management seat pivotably connected between the first and second cable management arms;
an extension board fixed to the cable management seat;
a support seat having a support board;
a first connection element connected to the first cable management arm;
a second connection element connected to the second cable management arm;
a third connection element connected to the support seat;
a first support member having a first connecting end and a first free end which is located corresponding to the first connecting end, the first support member pivotably connected to the support seat by the first connecting end, the first support member contacting the support board of the support seat;
a second support member having a second connecting end and a second free end which is located corresponding to the second connecting end, the second support member slidably connected to the first support member so as to extend relative to the first support member to move the second free end away from the first support member, the second free end having a guide member which is extended therefrom and located between the first and second cable management arms;
a first resilient member connected between the first and second support members so as to provide a pull force to the second support member; and
a slide pivotably connected to the extension board and slidably connected to the second support member;
wherein, the first cable management arm is connected to a stationary first position by the first connection element, the second cable management arm is connected to a changeable second position by the second connection element, the support seat is connected to a stationary third position by the third connection element, when the second connection element of the second cable management arm is moved away from the first connection element of the first cable management arm, the cable management seat slides along the second support member by the slide and moves away from the support seat, the slide contacts the guide member and extends the second support member relative to the first support member so as to swing the first support member relative to the support seat.

2. The device as claimed in claim 1, wherein the second support member has a block at the second connecting end, and the block is located corresponding to the slide, so that the slide slides between the guide member and the block.

3. The device as claimed in claim 1, wherein the first support member has a first hook and the second support member has a second hook, the first resilient member is connected to the first and second hooks.

4. The device as claimed in claim 1, wherein the support seat, the third connection element and the first support member are pivotably connected to each other by a pivotal member.

5. The device as claimed in claim 4, wherein the support board of the support seat extends substantially horizontally and has a round periphery whose center of circle is the same with the center of the pivotal member, a pin connected to the first support member, and the pin slidably contacts the periphery of the support board.

6. The device as claimed in claim 4, wherein the support board of the support seat has two first stops, a range of the first support member that is pivotable relative to the support seat is restricted between the two first stops.

7. The device as claimed in claim 1, wherein the extension board has a rib extending downward, and the rib contacts the slide.

8. The device as claimed in claim 1, further comprising a stop member connected to the support seat and having two second stops, wherein the third connection element has an extension portion located corresponding to the two second stops, one of the two second stops of the stop member contacts the extension portion of the third connection element.

9. The device as claimed in claim 1, further comprising a first slide assembly which comprises a first stationary rail and a first movable rail which moves longitudinally relative to the first stationary rail, a second slide assembly comprising a second stationary rail and a second movable rail which moves longitudinally relative to the second stationary rail, wherein the first connection element is installed to the first stationary rail and fixedly located at the first position, the second connection element is installed to the first movable rail and located at the second position which is changeable when the first movable rail is moved relative to the first stationary rail, the third connection element is installed to the second stationary rail of the second rail assembly and fixedly located at the third position.

10. A cable management system comprising:
a first slide assembly comprising a first stationary rail and a first movable rail which moves longitudinally relative to the first stationary rail;
a second slide assembly comprising a second stationary rail and a second movable rail which moves longitudinally relative to the second stationary rail;
a first cable management arm connected to the first stationary rail of the first slide assembly;
a second cable management arm connected to the first movable rail of the first slide assembly;
a cable management seat pivotably connected between the first and second cable management arms;
a support seat connected to the second stationary rail of the second slide assembly;
a first support member having a first connecting end and a first free end which is located corresponding to the first connecting end, the first connecting end pivotably connected to the support seat;
a second support member having a second connecting end and a second free end which is located corresponding to the second connecting end, the second connecting end slidably connected to the first support member, the second free end having a guide member which is extended therefrom and located between the first and second cable management arms;
a first resilient member connected between the first and second support members; and
a slide pivotably connected to the cable management seat and slidably connected to the second support member;
wherein, when the first and second slide assemblies are pulled out, the second cable management arm is moved away from the first cable management arm, the slide slides along the second support member and moves away from the support seat, the slide contacts the guide member and extends the second support member relative to the first support member so as to swing the first support member relative to the support seat;
when the first and second slide assemblies are retracted, the second cable management arm is retracted relative to the first cable management arm, the second cable management arm contacts the guide member and drives the second support member which moves in response to the first resilient member and relative to the first support member.

* * * * *